United States Patent [19]
Bokros et al.

[11] 3,977,896
[45] Aug. 31, 1976

[54] PROCESS FOR DEPOSITING PYROLYTIC CARBON COATINGS

[75] Inventors: Jack C. Bokros; Robert J. Akins, Sr., both of San Diego, Calif.

[73] Assignee: General Atomic Company, San Diego, Calif.

[22] Filed: Mar. 9, 1972

[21] Appl. No.: 233,246

[52] U.S. Cl. ............................ 427/213; 427/212.6; 428/87
[51] Int. Cl. ........................................... C01b 31/04
[58] Field of Search ....... 117/46 CG, 46 CB, 100 B, 117/100 R, DIG. 6, 169 R

[56] References Cited
UNITED STATES PATENTS

| | | | |
|---|---|---|---|
| 2,414,625 | 1/1947 | Abrams et al. | 117/DIG. 6 |
| 2,719,779 | 10/1955 | Bray et al. | 117/46 CG |
| 3,399,969 | 9/1968 | Bokros et al. | 117/46 CB |

*Primary Examiner*—William D. Martin
*Assistant Examiner*—Janyce A. Bell
*Attorney, Agent, or Firm*—Fitch, Even, Tabin & Luedeka

[57] ABSTRACT

Fluidized bed process for coating materials with pyrolytic carbon. A gaseous atmosphere including a carbonaceous substance is flowed upward through a vertical heated enclosure to fluidize a bed of particles therein. An exit conduit extends into the particle bed and a controlled flow of inert gas is fed through the conduit to regulate the exit passage of particles from the bed. Additional particles are added to the bed from above.

10 Claims, 1 Drawing Figure

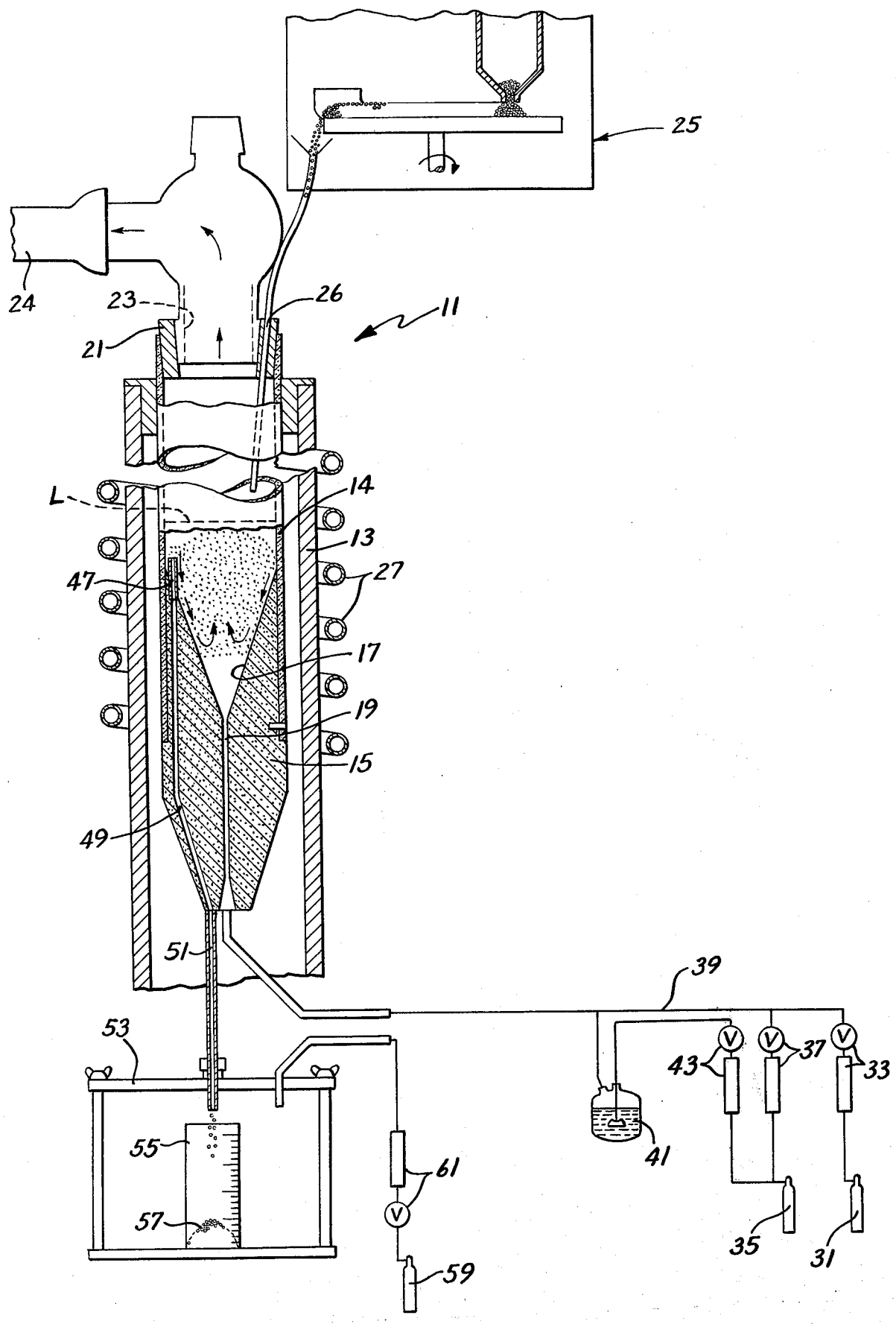

PROCESS FOR DEPOSITING PYROLYTIC CARBON COATINGS

This application relates to processes for depositing pyrolytic carbon having desired physical characteristics and to apparatus for facilitating such deposition processes.

Pyrolytic carbon may be deposited by thermally decomposing gaseous hydrocarbons or other carbonaceous substances in vaporous form in the presence of a substrate whereupon the deposition will take place. It is well known to coat substrates with layers of pyrolytic carbon for various different purposes. In this respect, the coating may oftentimes completely envelop the substrate, and the composite coated substrate may be the desired end product. In other instances, a very large object or a mandrel may be coated on less than all sides with an extremely thick layer of pyrolytic carbon, and subsequently the mandrel may be machined away or otherwise removed whereby the monolithic coating becomes the desired end product. The present invention is concerned with all such instances whether or not the underlying substrate is eventually removed.

When pyrolytic carbon is deposited in a fluidized bed apparatus, one of the variables upon which the structure of the pyrolytic carbon will be dependent is the available deposition surface area, relative to the volume of the furnace enclosure wherein the deposition is occurring. Pyrolytic carbon which has a microstructure that is free of growth features will be deposited when the relative amount of deposition surface area is fairly high. Thus, when relatively large objects, for example, objects having at least one dimension equal to 5 mm. or more, are being coated, an ancillary bed of small particles (usually of a size measured in microns) are included within the furnace enclosure together with the larger object or objects. This arrangement provides sufficient available total surface area to assure that pyrolytic carbon having the desired crystalline form will be deposited. In addition, the random motion of large objects in fluidized beds provide for a relatively uniform deposition of carbon on all surfaces.

However, whenever such submillimeter particles are being coated in a fluidized bed, the total surface area of the particles begins to increase significantly as the diameters of the pyrolytic carbon-coated particles grow. This change in the available deposition surface area in the fluidized bed will result in a change in the physical characteristics of the pyrolytic carbon being deposited if the other coating variables are held constant, e.g., coating temperature, gas flow rate and gas composition; and moreover, when the bed reaches some maximun size, it will collapse and thus limit the thickness of the carbon coating that can be deposited on levitated substrates under constant input conditions. Changes in the physical characteristics of the carbon deposited may be undesirable for any of a number of reasons.

It is an object of the present invention to provide an improved process for the deposition of thick coatings of pyrolytic carbon having uniform physical properties. Another object is to provide a process for depositing a layer of pyrolytic carbon of substantial thickness having uniform density and crystalline properties throughout its entire thickness. A further object is to provide a process for depositing pyrolytic carbon of excellent structural strength which is uniform throughout in its physical properties. Still another object is to provide apparatus for depositing pyrolytic carbon in a fluidized bed, which pyrolytic carbon has the uniform physical properties. These and other objects of the present invention will become evident from a reading of the following description in conjunction with the accompanying drawing which is a diagrammatic illustration of apparatus for performing deposition processes in accordance with the present invention.

It has been found that pyrolytic carbon having good structural strength and uniform physical properties can be deposited as relatively thick coatings upon relatively large objects in the accompaniment of particles if the available fluidized bed surface area is maintained relatively constant by withdrawing particles which have become enlarged in size as a result of coating and feeding smaller size particles into the deposition enclosure. Very generally, the availability of a relatively large amount of deposition surface area in a furnace enclosure of a given volume facilitates the efficient deposition of pyrolytic carbon which is either isotropic or laminar in microstructure and without growth features. In contrast when carbon is deposited on a fixed substrate (e.g., a mandrel) in a chamber without a bed of particles, large gradients in gas composition are established at the gas-solid interfaces where the deposition is occurring, and growth features develop in the microstructure of the deposited carbon. Illustrations and theoretical considerations are reviewed in J. C. Bokros, "The Preparation, Structure, and Properties of Pyrolytic Carbon," in *Chemistry and Physics of Carbon*, Vol. 5, P. L. Walker (ed.) Marcel Dekker, New York, 1969, Chapter 1.

The deposition of the laminar or isotropic carbons without growth features in fluidized beds depends on several different variables as described in the above reference. The deposition of either columnar or granular pyrolytic carbon is undesirable because such columnar and granular pyrolytic carbon does not have the high structural strength that is obtainable in isotropic and laminar carbon. Pyrolytic carbon having a modulus of rupture of at least about $25 \times 10^3$ p.s.i. is considered to have good structural strength for purposes where pyrolytic carbon is suited for use. The definitions of the different crystalline carbon structures are set forth in U.S. Pat. No. 3,298,921, which issued on Jan. 17, 1967 to Jack C. Bokros et al.

The crystalline structure, the density and other physical properties, such as the coefficient of thermal expansion, of pyrolytic carbon deposited by the thermal decomposition of a vaporous carbonaceous substance are dependent upon several independently variable operating conditions within the coating apparatus being employed. These conditions include the temperature of the substrate surfaces upon which the deposition is occurring, the overall chemical composition of the atmosphere from which deposition is occurring, the partial pressure of the vaporous carbonaceous substance, the surface area to volume ratio in the active deposition region of the coating apparatus, and the contact time (a parameter based upon the gas flow rate and cross sectional area of the furnace enclosure). Although various of these conditions can be easily regulated and therefore maintained at a constant desired value in many different types of coating apparatus, the surface area to volume ratio is inherently subject to constant change because there is a continuous gradual increase in the total surface area as the items being coated grow in size as the result of the deposition thereupon. When a bed of small spheroids or the like, having an average size between about 50 microns and 600 microns, is present in the active deposition surface region (either because they are the products being coated, e.g., in the case of nuclear fuel particles, or because they are associated with other objects being coated so as to increase the total surface area to void volume ratio), such small particles increase relatively rapidly in surface area as the diameters of these particles grow during deposition of pyrolytic carbon.

A desired surface area to volume ratio is initially provided by starting with an appropriate amount of particles of a particular average size to constitute the fluidized bed. Preferably, an initial surface area to volume ratio is provided near the lower end of the range that produces crystalline pyrolytic carbon having the physical properties desired. Thereafter, as the growing thickness of the deposited pyrolytic carbon layers increases the total surface area, withdrawal of some of the coated particles is initiated so as to decrease the total number of particles to thereby maintain a specific surface area or to regulate its increase in a controlled manner. Thereafter, replacement of the particles being withdrawn with particles of much smaller size is begun.

In coating operations where it is desirable to employ a relatively large surface area to volume ratio, a coating apparatus is of course employed which can maintain such a bed of particles in motion and in association with any larger objects that may also be coated. Examples of suitable coating apparatus of this type include, for example, fluidized bed coaters and rotating drum coaters. A fluidized bed coater is preferred because it is felt that it can most efficiently and satisfactorily perform the pyrolytic carbon deposition process, and hereinafter reference is made to fluidized bed coaters.

A suitable fluidized bed coating apparatus 11 is depicted in the FIGURE. The apparatus 11 includes a furnace having cylindrical outer shell 13. The furnace shell 13 supports the coating enclosure which is defined by a tube 14 having an insert 15 affixed thereto at its lower end. The insert 15 provides the internal coating enclosure with a conical bottom surface 17. A central passageway 19 extends vertically upward through the insert 15, coaxial with the tube 14, and the coating and fluidizing atmosphere is supplied upward through this passageway.

The upper end of the tube 14 is provided with a removable closure 21 that may be mounted in any suitable manner, the closure 21 includes a central exit passageway 23 through which the fluidizing and coating gases leave the furnace enclosure and which is connected to an exit conduit 24 through which the gases may be routed for subsequent treatment if desired. An injection device 25 is mounted above the closure and is designed to feed minute particles into the coating enclosure at a desired rate by dropping them downward through an opening 26 in the closure where they will fall nearly the length of the tube 14 until they enter and become a part of the fluidized bed. Induction heating means 27, which is well known in this art, is provided exterior the lower end of the shell 13 for heating the active deposition region of the furnace and the particles and objects being coated to the desired deposition temperature.

In the fluidized bed coating apparatus 11, sometimes referred to hereinafter as a "steady-state bed", the bed of minute particles, submillimeter in size, are levitated generally near the bottom of the heating enclosure in approximately the location shown in the FIGURE by the upward flowing gas stream. The gas stream is usually made up of a mixture of an inert fluidizing gas plus a carbonaceous substance, such as a gaseous hydrocarbon, for example, methane, ethane, propane, butane and acetylene, or some other carbon-containing substance that is gaseous or easily vaporizable. In the FIGURE, a source 31 of hydrocarbon is illustrated which is equipped with a flow-regulating valve arrangement 33. Also illustrated is a source 35 of inert gas, for example, helium, argon or nitrogen, which is likewise equipped with a suitable flow-regulating valve arrangement 37. These two sources flow into a common line 39 which connects to the vertical passageway 19 in the insert 15.

Instead of depositing a coating which is entirely pyrolytic carbon, it may be desirable to alloy the carbon with a suitable carbide-forming additive that can be codeposited along with the pyrolytic carbon. For example, silicon, which forms silicon carbide, can be dispersed as silicon carbide throughout the pyrolytic carbon in an amount up to about 20 weight percent and will add strength to the pyrolytic carbon structure without detracting from otherwise desirable physical properties of the pyrolytic carbon. Examples of some other carbide-forming elements which might be used as additives include boron, tungsten, tantalum, niobium, vanadium, molybdenum, aluminum, zirconium, titanium and hafnium. Such an additive is not used in an amount greater than about 30 atom percent, based upon total atoms of carbon plus the additive element, and generally not in an amount greater than about 20 atom percent. Usually, the carbide-forming additive is incorporated within the fluidizing and coating atmosphere by bubbling all or a part of the inert gas stream through a bath 41 containing a volatile liquid compound of the additive element in question. As illustrated in the FIGURE, a suitable flow control valve arrangement 43 is provided to regulate the proportion of the inert gas that will be passed through the additive bath 41.

The total flow of the gas upward through the coating enclosure is regulated so that the fluidized bed occupies the region near the bottom of the tube 14 as depicted in the FIGURE. The fluidized bed region initially extends for about 5 cm. above the uppermost point of the conical surface 17 of the inert 15. The upward flow of the gaseous atmosphere through the central passageway causes a generally annular flow pattern to be established in the fluidized bed region, with the minute particles traveling upward in the central portion of the enclosure and then downward generally along the outer perimeter thereof. As the coating operation proceeds and the thickness of the deposited layers grow, the total available deposition surface area in the fluidized bed increases. One effect of this increase is an expansion of the fluidized bed upward in the tube, as for example, to the approximate level depicted by the dotted line L.

A withdrawal tube 47 is provided which extends upward from the conical surface 17 of the insert for a predetermined distance which is preferably less than the 5 cm. distance referred to above so that the open upper end of the tube 47 is below the level of the bed. The withdrawal tube 47 connects to an exit passageway 49 which is located adjacent the periphery of the insert 15 and which extends down to an opening at the bottom thereof. A discharge pipe 51 connects the opening at the bottom of the exit passageway 49 to a collection chamber 53 which is suitably sealed from the atmosphere and which contains a volume measuring device, such as a calibrated glass cylinder 55, at the bottom thereof into which particles 57 falling through the withdrawal tube 47 will ultimately be directed. The collection chamber 53 is pressurized with inert gas from a suitable source 59, and the flow of the inert gas is controlled by a regulating valve 61.

The flow of inert gas through the collection chamber 53 and up the passageway 49 and out the upper end of the withdrawal tube 47 is used to control the rate at which the coated particles 57 are withdrawn from the fluidized bed in order to maintain the desired bed size. Initially, sufficient gas flow is maintained upward through the tube 47 to prevent any particles from exiting. By decreasing the flow rate of inert gas through the withdrawal tube 47, the withdrawal of particles will begin. Thereafter, further decrease or increase of the flow rate of gas through the withdrawal tube 47 will, respectively, either increase or slow the rate of withdrawal of particles. Thus, the withdrawal of particles so as to effect a decrease in the total available deposition surface area to at least partially offset the continuing increase in surface area (resulting from the growth in diameter of the particles) can be employed to maintain the total available deposition surface area within a desired range in order to deposit pyrolytic carbon having uniform physical characteristics. When the large objects being coated increase in weight as a result of the carbon coatings, it may be desirable to allow the bed surface area (and weight) to slowly increase to prevent collapse of the heavier objects being levitated.

If not too great a thickness of pyrolytic carbon coatings is required, withdrawal of particles along might be employed to maintain the available deposition surface area within the desired range. However, particularly where deposits of pyrolytic carbon of substantial thickness are desired, e.g., greater than about 150 microns, it has been found that the best results are obtained when replenishment of the particle bed with small particles is carried out simultaneously with the withdrawal of coated particles. Replenishment is usually effected with particles of about the same size as those particles initially making up the bed, which are therefore much smaller than the coated particles being removed.

When particles are used having a density of at least about 3 grams/cm$^3$ (i.e., greater than the density of the carbon coating) are used, they will gradually become less dense as they grow in size. The smaller uncoated particles tend to remain in the lower portion of the bed while the less dense coated particles are levitated to the upper portion of the bed. By locating the entrance to the withdrawal tube 47 in the upper one-third of the fluidized bed, only the particles having coatings of substantial thickness are withdrawn. By using a steady-state bed and assuring the programmed withdrawal of coated particles and the simultaneous replenishment of smaller size particles, it has been found that the thickness of the coating being deposited will be essentially limited only by the size of the furnace enclosure or by the weight of a substrate being levitated, and that the pyrolytic carbon deposit will continue to be uniform in its physical properties. Accordingly, the process, for example, permits the deposition of a large monolithic pyrolytic carbon deposit upon a mandrel that may be hung within the confines of the bed (as opposed to levitating a smaller object together with the particles), and such a monolithic carbon structure may be used for a variety of different purposes.

As previously indicated, the desire to have uniformity in the physical characteristics of the pyrolytic carbon deposited is often prompted by the intended use of the carbon which will require particular structural strength. Accordingly, the carbon being deposited will usually be isotropic carbon or laminar carbon. Isotropic carbon is defined as a carbon structure which possesses very little preferred orientation, which has a broad range of apparent crystallite sizes, and which has a density varying from about 1.4 to about 2.2 grams per cm$^3$. The microstructure of isotropic carbon, when viewed metallographically under polarized light, is not optically active and is featureless. Laminar carbon possesses layer planes which are oriented parallel to the surface of the substrate, has about the same density range as isotropic carbon, but has a microstructure which is optically active, showing the typical "Maltese-cross" pattern on spherical particles under polarized light.

The determination of whether a carbon structure is isotropic or anisotropic is easily made using X-ray diffraction from which the variations and the intensities of the X-rays diffracted from the layer planes are used to calculate the Bacon Anisotropic Factor (BAF) of the carbon. The BAF is an accepted measure of preferred orientation of the layer planes in the carbon structure. Technique of measurement and a complete explanation of the scale of measurement is set forth in an article by G. E. Bacon entitled "A Method for Determining the Degree of Orientation of Graphite", which appeared in the Journal of Applied Chemistry, Volume VI, Page 477 (1956). The lowest point on the Bacon scale is 1.0 which defines perfectly isotropic carbon. Carbon measuring about 1.3 or less is generally termed isotropic.

To deposit isotropic pyrolytic carbon, methane may be employed in combination with inert carrier gas, such as helium or argon, at a temperature of approximately 1500°C. and above, depending upon the density which is desired. Isotropic pyrolytic carbon may also be deposited from less stable hydrocarbons, such as butane, propane and propylene, as a part of a mixture with an inert gas at a lower temperature, for example in the range of about 1200°C. to about 1400°C.

One of the parameters mentioned hereinbefore, i.e., "contact time", is computed using the following relationship:

$$\text{contact time} = \frac{\text{deposition region volume}}{\text{rate of gas flow}}.$$

Deposition region volume is the volume of the heated zone less that taken up by the objects being coated. The rate of gas flow in the formula is the flow at deposition conditions. Normally, the rate of gas flow at room temperature will be measured, and this value is converted to the deposition temperature using the direct relation of the temperature measured in degrees Kelvin. The coating process is carried out at atmospheric pressure.

It is believed that the invention may be more clearly understood by examining a coating process wherein apparatus similar to that shown in the FIGURE is employed. In one embodiment of such an apparatus, for example, the active deposition region volume may measure about 544 cm$^3$, and a gaseous atmosphere consisting of a mixture of propane and helium that is about 60 percent helium is employed. The total gas flow rate is adjusted to provide a contact time of about 0.2 sec., and a deposition temperature of at least about 1200°C. and preferably of about 1350°C. is employed. If the ratio of available deposition surface area measured in square centimeters, to the available deposition region volume, measured in cubic centimeters, is maintained above a certain value, pyrolytic carbon which is isotropic in character will be efficiently deposited. To accomplish this purpose, the ratio should be at least about 2 to 1 and preferably should be at least about 5 to 1. Often, the ratio is maintained between about 5:1 and about 10:1, and ratios of 20:1 and above may be used.

The total surface area of a bed of minute particles can increase fairly rapidly. For example, consider a single spheroid 300 microns in diameter which has an initial surface area of about $2.83 \times 10^5$ square microns. Apply a 50-micron thick pyrolytic carbon coating uniformly to the spheroid, and the diameter of the resultant spheroid becomes 400 microns. The 400 micron spheroid has a surface area of approximately $5.05 \times 10^5$ square microns, which is an increase in surface area of almost 80 percent when the increase in the diameter was only 33 percent.

As an illustration, when a bed of submillimeter particles is employed sufficient to provide a surface area of about 2500 square centimeters, pyrolytic carbon having a BAF of about 1.3, a density of about 2.2 grams per $cm^3$ and an apparent crystallite size of about 40A. is deposited at coating conditions mentioned above. Substantial changes in these characteristics begin to occur when all of the coating conditions are held constant and the total available deposition surface area increases past about 8000 sq. cm. Assuming, for purposes of illustration, that the particles being coated were spheroids having an average diameter of about 350 microns, a 25 percent increase in the total surface area occurs when the diameter of the particles increases about 11 to 12 percent, i.e., when a coating having a thickness of about 20 microns has been deposited. In order to prevent a change in physical characteristics which will otherwise occur and thus maintain uniformity in physical properties throughout the pyrolytic carbon coating, withdrawal of particles is begun when the coating thickness reaches about 20 microns. The flow rate of helium upward through the withdrawal tube 47 which regulates the rate of withdrawal of particles depends upon the diameter of the tube and the density of the small particles; thus, absolute values cannot be given. Usually any adjustments required are made visably to achieve the desired volumetric removal as measured by the device 55. So as to prevent severe depletion of the particle bed that might subsequently result in a change in the overall coating operation, replenishment of the particle bed is carried out by continuously or periodically injecting new particles having the same average size as those from which the bed was originally formed. For example, 10 grams of particles may be fed into the bed each 5 minutes.

When the coating of one or more fairly large objects having a dimension greater than about 5 millimeters is being carried out, so that the function of the particles is strictly ancillary, fairly inexpensive particles, such as particles of zirconium dioxide, are employed because the ultimate fate of the particles withdrawn from the coating apparatus becomes relatively unimportant. When the coating process is being carried out to specifically coat the particles themselves, as for example in the case where nuclear fuel particles are being coated, and when the particles themselves are quite expensive, the particles withdrawn would be carefully reprocessed to recover the valuable material. For example, the pyrolytic carbon coatings might be removed from nuclear fuel particles withdrawn through the withdrawal tube 47 by oxidation or by centrifugal grinding or the like or the particles may be recycled through the coater.

As earlier indicated, control of the withdrawal and any replenishment should be carefully carried out so as to achieve the desired objective. Withdrawal is controlled by regulating the flow of inert gas upward through the withdrawal tube 47 so as to obtain the desired removal of the predetermined number of particles 57 per unit of time. Likewise, as the coating continues, the injection device 25 is programmed to feed additional units of particles into the coating apparatus at the desired time interval. Any suitable type of commercially available control device can be used for this purpose.

As can be seen, the process contemplated is a batch process in which it is desired to apply a coating of a predetermined thickness which is uniform in its physical properties throughout. In general, the physical size of the apparatus contemplated is relatively small, and upon completion of the desired coating, manual unloading of the apparatus is contemplated. Of course, more sophisticated and larger apparatus embodying the principles set forth herein could be constructed, in which case some simple mechanical assist for the unloading might be used.

As previously indicated, the character of the pyrolytic carbon deposited depends upon a number of variables, and there are mutual dependencies between the variables. The ratio of the amount of surface area relative to the volume required to form a given structure is dependent, for example, upon the particular hydrocarbon used and upon the deposition temperature. For example, at 1350°C. it is more difficult to deposit isotropic carbon from methane than from less stable hydrocarbons. The preferred hydrocarbons are those having molecular weights between about 20 and 75, and a temperature of between about 1200°C. and 1400°C. with a contact time between about 0.1 sec. and about 0.3 sec. may be used. Isotropic pyrolytic carbon may be formed from hydrocarbons such as propane, propylene and butane over a wide range of area to volume ratios. The variations of structure with deposition conditions are reviewed and interpreted in Chapter 1 of *Physics and Chemistry of Carbon*, Vol. 5, set forth hereinbefore.

The following Examples illustrate several processes embodying features of the invention but should not be considered to constitute limits upon the invention which is defined by the claims.

EXAMPLE I

In one example of a process for depositing isotropic carbon, a fluidized bed coating apparatus 11 is employed similar to that depicted in the FIGURE. The coating tube 14 has an internal diameter of about 9 centimeters. The active deposition region of the tube is heated to the desired deposition temperature by the induction heating means 27. An upward flow of helium is established through the central passageway 19 in the insert, and the temperature of the deposition region is raised to about 1350°C.

The active deposition region depicted in the FIGURE has an approximate void volume equal to the overall volume (about 540 cm³) minus the volume of the charge of minute particles to be added. Total deposition surface area is equal to the surface area of the internal wall of this portion of the enclosure (about 50 cm²) plus the surface area of the charge of particles which is to be fluidized in the active deposition region of the coating apparatus.

About 200 grams of particles of uranium carbide between about 250 microns and about 600 microns in size, with an average particle size of about 350 microns, are employed in the initial make-up of the fluidized bed. These particles provide approximately 4000 square centimeters of surface area in the active deposition region, while occupying a volume less than about 30 cubic centimeters. Under these conditions, the total surface area to void volume ratio is about 4000:510 or about 7.8:1.

When the fluidized bed is established under these conditions, the particles are heated to the temperature of about 1350°C. At this point, the flow of helium is decreased while simultaneously substituting a like amount of propane so that the partial pressure of the propane in the stream of upward flowing gas is about 40 volume percent (total pressure of about 1 atmosphere). Under these conditions dense isotropic pyrolytic carbon is deposited upon the uranium carbide particles. The rate of deposition of isotropic carbon is about 4–5 microns per minute.

The withdrawal tube 47 extends above the top of the insert for a distance of about 1.9 cm. and has an internal diameter of about 8 mm. A high rate of flow of helium is established upward therethrough at the initial establishment of the fluidized bed. When the deposition of pyrolytic carbon reaches about 20 microns thick, the surface area of the particle charge has grown substantially and the flow of helium upward through the withdrawal tube 47 is reduced. As a result, particles begin to fall into the open upper end of the withdrawal tube. A continual discharge of about 150 cm³ of particles per hour is quickly established at the reduced flow rate of helium upward through the withdrawal tube. Replenishment with very small charges of uranium carbide particles of the same characteristics of the initial charge is begun. Every 5 minutes, a charge of 20 grams of uranium carbide particles is fed into the furnace via the feed device 25 above the upper closure 21. It has been determined that continuing operation under these withdrawal and periodic replenishment conditions results in the maintenance of the total deposition surface area at about 4900 sq. cm. even though the deposition process is carried on for a period of hours.

At the end of about 30 minutes, the coating operation is terminated, and the particles are withdrawn and examined. Examination shows that the carbon deposited has a density of about 1.85 grams/cm³ and a BAF of about 1.1, and there is no measurable difference in either BAF or density between the pyrolytic carbon initially deposited and that at the exterior surface which was deposited near the end of the coating run. The dense isotropic pyrolytic carbon is considered to have excellent strength and to be extremely well suited for fission product retention and for other uses wherein it is important that the carbon be uniform in physical properties throughout and essentially free of any significant internal stresses.

EXAMPLE II

The apparatus used in Example I is now employed to deposit a pyrolytic carbon coating upon 21 small hollow spheres of graphite, each having a surface area of about 11 square centimeters. The 21 spheres are levitated along with a 100 gram charge of zirconium oxide particles between about 250 microns and 600 microns in size (average size about 350 microns). The charge of these particles provides approximately 3100 square centimeters of surface area in the active deposition region.

With the fluidized bed established under these conditions, the particles are heated to the temperature of about 1350°C. When coating is ready to begin, a flow rate of about 9 liters per minute of helium and 6 liters per minute of propane is established upward through the passageway 19, so that the partial pressure of the propane in the stream of upward flowing gas is about 40 volume percent (total pressure of about 1 atmosphere). All of the helium is bubbled through a bath 41 of methyltrichlorosilane. Under these conditions, a mixture of dense isotropic pyrolytic carbon and silicon carbide is deposited on the graphite spheres and upon the zirconium oxide particles. The rate of deposition of isotropic carbon is about 6–7 microns per minute.

An initial flow of helium of about 4000 cc. per minute (STP) is established upward through the withdrawal tube 47 at the initial establishment of the fluidized bed to prevent the withdrawal of any particles. When the thickness of the pyrolytic carbon deposit reaches about 20 microns, the withdrawal and replenishment of particles is begun. The valve 61 is adjusted so that the rate of flow of helium through the line 51 and upward out the withdrawal tube is reduced to about 2000 cc. per minute. As a result, particles begin to fall into the open upper end of the withdrawal tube, and a continual discharge of about 90 cm.³ of particles per hour is established. Simultaneously, replenishment with very small charges of zirconium oxide particles of the same characteristics of the initial charge is begun. Every minute, a charge of about 1 gram of zirconium oxide particles is fed into the furnace via the feed device 25 above the upper closure 21. Continuing operation under the foregoing withdrawal and replenishment conditions results in the maintenance of a substantially constant total deposition surface area even though the deposition process is carried on for a period of hours.

At the end of about 75 minutes, the coating operation is terminated, and the hollow spheres are withdrawn and examined. Examination shows that the carbon-silicon carbide alloy coating has a density of about 2.2 grams/cm³ and a BAF of about 1.3. There is no measurable difference in either BAF or density between the pyrolytic carbon initially deposited adjacent the surface of the spheres and that at the exterior surface of the coated layer which was deposited near the end of the coating run. Testing shows that the resultant pyrolytic carbon-silicon carbide coating has a modulus of rupture of about $40 \times 10^3$ p.s.i. The dense isotropic pyrolytic carbon-silicon carbide coating is considered to have excellent structural strength and to be extremely well suited for uses wherein it is important that the carbon be uniform in physical properties throughout, be essentially free of any significant uncontrolled internal stresses due to structural inhomogeneities in the coating and have good wear resistance.

Various of the features of the invention are set forth in the following claims.

What is claimed is:

1. In a process for depositing pyrolytic carbon coatings, which process includes disposing particles less than a millimeter in size and having an initial density of at least about 3 gm/cm³ in a fluidized bed coating enclosure, flowing an atmosphere containing a carbonaceous substance through the enclosure while heating the particles to a temperature sufficient to cause thermal decomposition of said substance and deposition of pyrolytic carbon coatings, the improvement which comprises removing from the coating enclosure controlled numbers of particles which have grown in size as a result of said carbon deposition, said removal being carried out by gravity flow through withdrawal conduit means from the upper one-third of said fluidized bed and without disrupting said flow of said atmosphere through said enclosure, the rate at which said particles are removed from said enclosure being controlled by regulating the rate of flow of an inert gas stream which flows upward through the conduit means to create resistance to said gravity removal of said particles, and adding to the coating enclosure particles of smaller size in an amount proportional to said removed particles to maintain the total deposition surface area within the coating enclosure relatively constant.

2. The improved process in accordance with claim 1 wherein a fluidized bed of particles is established by passing a stream of gas upward therethrough, wherein the ratio of the total deposition surface area, measured in sq. cm., to the void volume thereof, measured in cu. cm., is at least about 2 to 1, and wherein the temperature of said particles is maintained at at least about 1200°C. and a mixture of helium and propane is employed.

3. The improved process in accordance with claim 1 wherein a layer of pyrolytic carbon at least about 150 microns thick is deposited.

4. The improved process in accordance with claim 1 wherein isotropic pyrolytic carbon is deposited and wherein the ratio of the total deposition surface area, measured in square centimeters, in the active region of the enclosure wherein deposition occurs, to the void volume, measured in cubic centimeters, of said active region is maintained at at least about 2 to 1.

5. The improved process in accordance with claim 4 wherein said ratio is maintained at a value not greater than about 20 to 1.

6. The improved process in accordance with claim 4 wherein said hydrocarbon is either propane or propylene.

7. The improved process in accordance with claim 4 wherein said atmosphere contains a carbonaceous substance plus an inert gas.

8. The improved process in accordance with claim 7 wherein the contact time of said atmosphere in the fluidized bed coater is between about 0.1 sec. and about 0.3 sec., said temperature is between about 1200°C. and 1400°C. and said carbonaceous substance is a hydrocarbon with molecular weight between about 20 and 75.

9. The improved process in accordance with claim 4 wherein at least one object having a dimension greater than about 5 millimeters is included in said enclosure for coating with pyrolytic carbon.

10. The improved process in accordance with claim 9 wherein the average size of said initial particles is between about 50 microns and about 600 microns.

* * * * *